US008294470B2

(12) United States Patent
Kim

(10) Patent No.: US 8,294,470 B2
(45) Date of Patent: Oct. 23, 2012

(54) ONE SHEET TEST DEVICE AND METHOD OF TESTING USING THE SAME

(75) Inventor: Sung-Kook Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 500 days.

(21) Appl. No.: 12/544,409

(22) Filed: Aug. 20, 2009

(65) Prior Publication Data

US 2010/0277183 A1 Nov. 4, 2010

(30) Foreign Application Priority Data

Apr. 30, 2009 (KR) ........................ 10-2009-0038224

(51) Int. Cl.
*G01R 31/08* (2006.01)
*G01R 31/26* (2006.01)

(52) U.S. Cl. ................................... 324/527; 324/760.02

(58) Field of Classification Search ........................ None
See application file for complete search history.

(56) References Cited

U.S. PATENT DOCUMENTS 4,940,934 A * 7/1990 Kawaguchi et al. ..... 324/760.02
7,701,413 B2 * 4/2010 Moon ............................ 345/60
8,049,217 B2 * 11/2011 Sung et al. ...................... 257/59
2005/0259040 A1 * 11/2005 Moon ............................ 345/60
2007/0001711 A1 * 1/2007 Kwak ........................... 324/770
2008/0238846 A1 * 10/2008 Brian ............................ 345/87
2010/0007369 A1 * 1/2010 Kwak ........................... 324/770
2011/0080173 A1 * 4/2011 Kim et al. ..................... 324/403

FOREIGN PATENT DOCUMENTS

CN 1700273 A 11/2005
KR 10-2004-0090618 10/2004
KR 10-2007-0001583 1/2007
KR 10 2007-0032485 A 3/2007
KR 10-2009-0023941 3/2009

* cited by examiner

*Primary Examiner* — Jermele M Hollington
(74) *Attorney, Agent, or Firm* — Lee & Morse, P.C.

(57) ABSTRACT

A one sheet test device and a method of testing using the same that can prevent a change of current characteristics due to a failure panel by measuring a current of normal panels except for the failure panel, when testing a one sheet substrate that includes panels, first wires that are arranged in a first direction between and connected to the panels, second wires that are arranged in a second direction different from the first direction between and connected to the panels. The test device includes voltage application units that are connected to the first and second wires, respectively, to apply a selected one of the first voltage and the second voltage to the corresponding wires; and a test unit that controls the voltage application units to measure an on-current and off-current of each of the panels.

19 Claims, 2 Drawing Sheets

ONE SHEET TEST DEVICE AND METHOD OF TESTING USING THE SAME

CROSS-REFERENCE TO RELATED APPLICATION

This application claims the benefit of Korean Application No. 10-2009-0038224, filed on Apr. 30, 2009 in the Korean Intellectual Property Office, the disclosure of which is incorporated herein by reference.

BACKGROUND OF THE INVENTION

1. Field of the Invention

Aspects of the present invention relate to a one sheet test device and a method of testing using the same.

2. Description of the Related Art

In general, panels of a plurality of organic light emitting displays are formed and scribed on one substrate (hereinafter, one sheet substrate), which is then divided into individual panels. Before cutting and dividing from the one sheet substrate and while in a one sheet substrate state, the panels perform a lighting process, a test process, or an aging process of each panel unit. In such processes, in order to drive each panel, a side surface of the one sheet substrate supplies a signal to the one sheet substrate using a common wire. In this case, when a lighting failure occurs in one of a plurality of panels, because the lighting failure has an influence on current characteristics of panels sharing a wire with the corresponding panel, an accurate test is not performed. Further, when a short occurs in the common wire, because a current of panels that are connected to the common wire does not flow to the test device, a test for the panels is not appropriately performed.

The above information disclosed in this Background section is only for enhancement of understanding of the background of the invention and therefore it may contain information that does not necessarily form the prior art that is already known in this country to a person of ordinary skill in the art.

SUMMARY OF THE INVENTION

Aspects of the present invention have been made in an effort to provide a one sheet test device and a method of testing using the same having advantages of accurately testing each panel when testing a one sheet.

An exemplary embodiment of the present invention provides a one sheet test device including: a plurality of panels that are formed on a one sheet substrate; a plurality of first wires that are arranged in a first direction between the plurality of panels to be connected to the plurality of panels, respectively; a plurality of second wires that are arranged in a second direction different from the first direction between the plurality of panels to be connected to the plurality of panels, respectively; a plurality of voltage application units that are connected to the plurality of first and second wires, respectively, to apply a selected one of a first voltage and a second voltage to the corresponding wires; and a test unit that controls the plurality of voltage application units to measure an on-current and off-current of each of the plurality of panels.

According to an aspect of the invention, the first voltage may be a power source voltage, and the second voltage may be a ground voltage.

Each of the plurality of voltage application units according to an aspect of the invention may include a power source that generates the first voltage; a first switch that is connected between a corresponding wire of the plurality of first and second wires and the power source; and a second switch that is connected between the corresponding wire of the plurality of first and second wires and an application terminal of the second voltage.

According to an aspect of the invention, the test unit may measure the off-current of each of the plurality of panels in a state where an inverse bias voltage is applied to the plurality of panels.

According to an aspect of the invention, the test unit may measure the on-current of each of the plurality of panels in a state where a bias voltage is applied to the plurality of panels.

According to an aspect of the invention, the test unit may detect a panel in which the off-current is a reference value or more among the plurality of panels and apply, when measuring the on-current, one of the first and second voltages to the first and second wires corresponding to the detected panel.

According to an aspect of the invention, the test unit may measure the on-current after a predetermined stabilization time period has elapsed from a time point at which the on-current starts to flow.

According to an aspect of the invention, the test unit may include a plurality of resistors that are connected between the plurality of second wires and the plurality of voltage application units, respectively; a plurality of amplifiers each that amplify and output a current that is applied to each of the plurality of resistors; a plurality of switchers each that are connected to an output terminal of each of the plurality of amplifiers; an A/D converter that is connected to the plurality of switchers to convert the output of the plurality of amplifiers to a digital signal; a current reading unit that reads the output of the A/D converter; and a switching controller that generates a switching controlling signal that controls the plurality of switchers and the plurality of voltage application units.

Another embodiment of the present invention provides a method of testing a one sheet test device including a plurality of panels that are formed on a one sheet substrate; a plurality of first wires that are arranged in a first direction between the plurality of panels to be connected to the plurality of panels, respectively; a plurality of second wires that are arranged in a second direction different from the first direction between the plurality of panels to be connected to the plurality of panels, respectively, the method including: measuring an off-current of each of the plurality of panels in a state where an inverse bias voltage is applied to the plurality of panels; and measuring an on-current of each of the plurality of panels in a state where a bias voltage is applied to the plurality of panels. The measuring of an on-current may include detecting a panel in which the off-current is a predetermined reference value or more among the plurality of panels; and applying one of the first and second voltages to the first and second wires corresponding to the detected panel. The measuring of an on-current may be performed after a predetermined stabilization time period has elapsed from a time point at which the on-current starts to flow.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
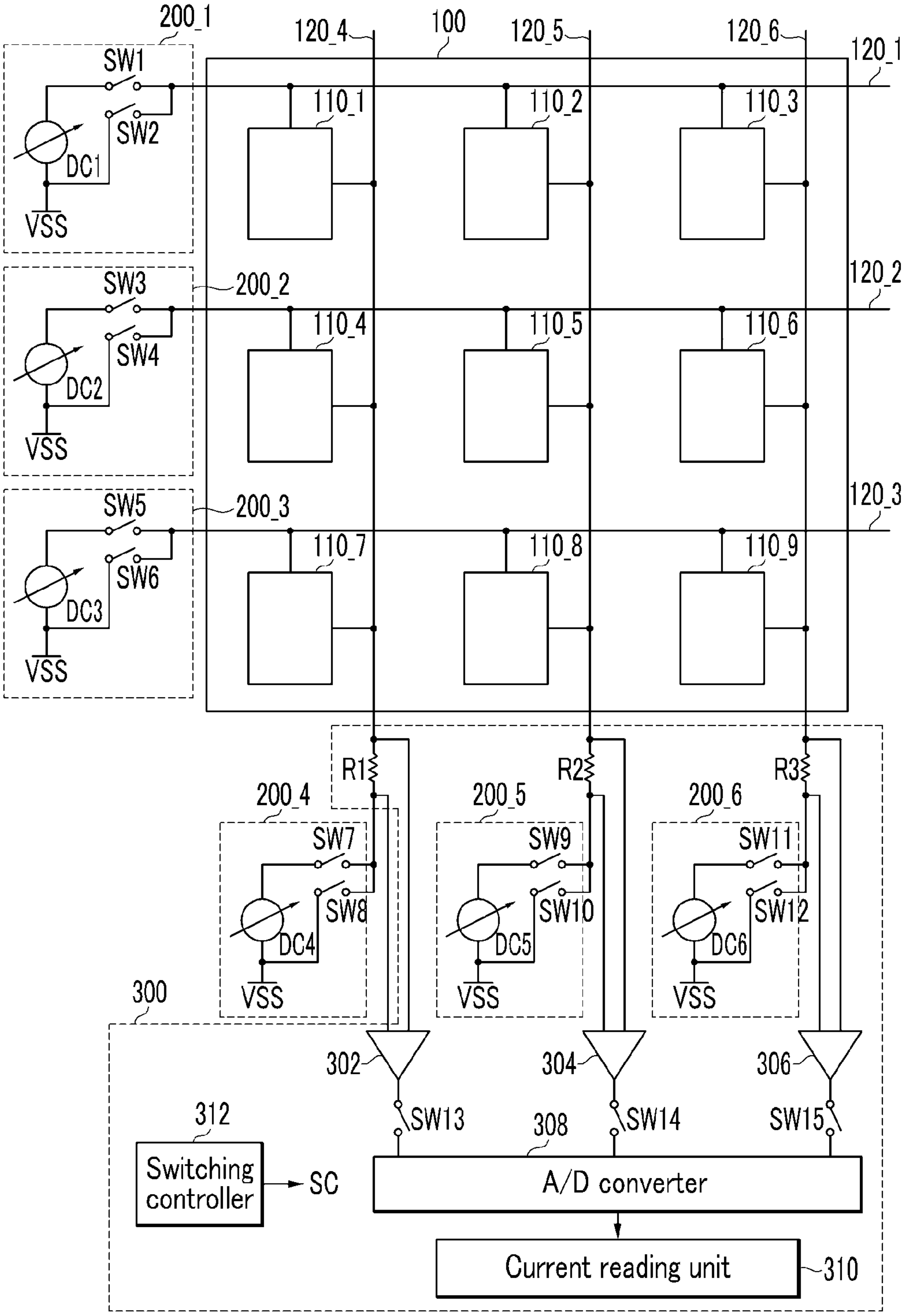
FIG. 1 is a diagram illustrating a one sheet test device according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Throughout this specification and the claims that follow, when it is described that an element is "connected" to another element, the element may be "directly connected" to the other element or "electrically connected" to the other element through a third element. In addition, unless explicitly described to the contrary, the word "comprise" and variations such as "comprises" or "comprising", will be understood to imply the inclusion of stated elements but not the exclusion of any other elements.

FIG. 1 is a diagram illustrating a one sheet test device according to an exemplary embodiment of the present invention. Referring to FIG. 1, the one sheet test device includes a one sheet substrate 100, first to sixth voltage application units 200_1-200_6, and a test unit 300. First to ninth panels 110_1-110_9 and first to sixth wires 120_1-120_6 are formed on the one sheet substrate 100. The first to ninth panels 110_1-110_9 are disposed in a matrix format, and the first to sixth wires 120_1-120_6 are disposed on the substrate 100 at a space between the first to ninth panels 110_1-110_9.

In the shown example, the first to third wires 120_1-120_3 are disposed on the substrate 100 in a row direction, and the fourth to sixth wires 120_4-120_6 are disposed on the substrate 100 in a column direction. The first panel 110_1 is connected to the first wire 120_1 and the fourth wire 120_4, and the second panel 110_2 is connected to the first wire 120_1 and the fifth wire 120_5. The third panel 110_3 is connected to the first wire 120_1 and the sixth wire 120_6, and the fourth panel 110_4 is connected to the second wire 120_2 and the fourth wire 120_4. The fifth panel 110_5 is connected to the second wire 120_2 and the fifth wire 120_5, and the sixth panel 110_6 is connected to the second wire 120_2 and the sixth wire 120_6. The seventh panel 110_7 is connected to the third wire 120_3 and the fourth wire 120_4, and the eighth panel 110_8 is connected to the third wire 120_3 and the fifth wire 120_5. The ninth panel 110_9 is connected to the third wire 120_3 and the sixth wire 120_6. In FIG. 1, for convenience of description, three panels are disposed in a horizontal direction and three panels are disposed in a vertical direction, however the present invention is not limited thereto and the quantity of panels can be adjusted. Further, the numbers of panels in each direction need not be equal in all aspects.

The first to sixth voltage application units 200_1 to 200_6 are connected to the first to sixth wires 120_1 to 120_6, respectively. The one sheet test device according to the shown exemplary embodiment has a double source mesh structure that can apply a power source voltage from both sides of the first to ninth panels 110_1-110_9. For this purpose, the quantity of the voltage application units is equal to that of the wires. The first to sixth voltage application units 200_1-200_6 apply one of the first voltage and the second voltage to the first to sixth wires 120_1-120_6 corresponding to the first to sixth voltage application units 200_1-200_6, respectively, according to the control of the test unit 300. The first voltage according to the present exemplary embodiment is a DC power source voltage of a predetermined level, and the second voltage is a ground voltage. While not required in all aspects, the first to sixth voltage application units 200_1-200_6 can be detachably connected to the first to sixth wires 120_1 to 120_6 so as to be reused with another one sheet substrate 100.

In the shown example, the first voltage application unit 200_1 includes first and second switches SW1 and SW2 and a first power source DC1. The first switch SW1 is connected between the first power source DC1 and the first wire 120_1, and the second switch SW2 is connected between an application terminal of a ground voltage VSS and the first wire 120_1. The second voltage application unit 200_2 includes third and fourth switches SW3 and SW4 and a second power source DC2. The third switch SW3 is connected between the second power source DC2 and the second wire 120_2, and the fourth switch SW4 is connected between an application terminal of the ground voltage VSS and the second wire 120_2. The third voltage application unit 200_3 includes fifth and sixth switches SW5 and SW6 and a third power source DC3. The fifth switch SW5 is connected between the third power source DC3 and the third wire 120_3, and the sixth switch SW6 is connected between an application terminal of the ground voltage VSS and the third wire 120_3. The fourth voltage application unit 200_4 includes seventh and eighth switches SW7 and SW8 and a fourth power source DC4. The seventh switch SW7 is connected between the fourth power source DC4 and the fourth wire 120_4, and the eighth switch SW8 is connected between an application terminal of the ground voltage VSS and the fourth wire 120_4. The fifth voltage application unit 200_5 includes ninth and tenth switches SW9 and SW10 and a fifth power source DC5. The ninth switch SW9 is connected between the fifth power source DC5 and the fifth wire 120_5, and the tenth switch SW10 is connected between an application terminal of the ground voltage VSS and the fifth wire 120_5. The sixth voltage application unit 200_6 includes eleventh and twelfth switches SW11 and SW12 and a sixth power source DC6. The eleventh switch SW11 is connected between the sixth power source DC6 and the sixth wire 120_6, and the eleventh switch SW11 is connected between an application terminal of the ground voltage VSS and the sixth wire 120_6. However, it is understood that the numbers of application units is not limited to the shown numbers, and that the types of switches is not particularly limited.

The test unit 300 controls the first to sixth voltage application units 200_6 to measure an on-current and off-current of each of the first to ninth panels 110_1-110_9. The test unit 300 applies a bias voltage to the first to ninth panels 110_1-110_9, thereby measuring an on-current of the first to ninth panels 110_1-110_9. The test unit 300 also applies an inverse bias voltage to the first to ninth panels 110_1-110_9, thereby measuring an off-current of the first to ninth panels 110_1-110_9. In the shown exemplary embodiment, in a state where the bias voltage is applied, a power source voltage is applied to the fourth to sixth wires 120_4-120_6, and a ground voltage is applied to the first to third wires 120_1-120_3. In a state where the inverse bias voltage is applied, a power source voltage is applied to the first to third wires 120_1-120_3, and a ground voltage is applied to the fourth to sixth wires 120_4-120_6.

For example, when measuring the on-current of the first panel 110_1, the test unit 300 applies a switching control signal SC corresponding to the second switch SW2 and the seventh switch SW7 thereto. In contrast, when measuring an off-current of the first panel 110_1, the test unit 300 applies a switching control signal SC corresponding to the first switch SW1 and the eighth switch SW8 thereto. In this way, by supplying a power source voltage in both directions, the on/off-current can be measured. The present invention is not limited thereto, according to a connection direction of pixels within the first to ninth panels 110_1-110_9, a bias voltage and an inverse bias voltage can be defined.

The test unit 300 according to the present exemplary embodiment measures an on-current after a predetermined stabilization time period has elapsed from a time point at which the on-current starts to flow. This is because an off-current and an on-current are sequentially measured and thus in a state where the off-current flows, when the on-current is immediately measured, the off-current has an influence on the on-current. Therefore, in the shown exemplary embodiment, the off-current is instantaneously canceled by the on-current and after the on-current is stabilized, the on-current is measured.

Figure 2:
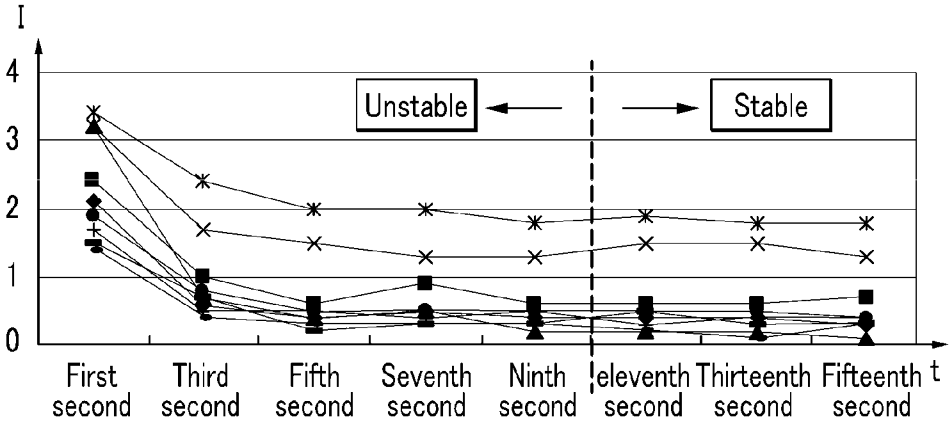
FIG. 2 is a graph illustrating a stabilization time period according to another exemplary embodiment of the present invention.

FIG. 2 is a graph illustrating a stabilization time period according to another exemplary embodiment of the present invention. A time point at which the on-current is stabilized is a time point before and after 10 seconds from a time point at which the on-current occurs, as shown in FIG. 2. That is, after 10 seconds have elapsed from a time point at which the on-current occurs, when the on-current is measured, an accurate test result can be obtained. However, it is understood that the stabilization time can be otherwise determined, and that test unit 300 need not always wait for the stabilization time before taking measurements in all aspects of the invention.

The test unit 300 includes first to third resistors R1-R3, first to third amplifiers 302, 304, and 306, twelfth to fourteenth switches SW12-SW14, an A/D converter 308, a current reading unit 310, and a switching controller 312. The first resistor R1 is connected between the fourth wire 120_4 and the fourth voltage application unit 200_4, and the second resistor R2 is connected between the fifth wire 120_5 and the fifth voltage application unit 200_5. The third resistor R3 is connected between the sixth wire 120_6 and the sixth voltage application unit 200_6. The first to third amplifiers 302, 304, and 306 receive a current flowing to the first to third resistors R1-R3, respectively, to amplify and output the current. The twelfth to fourteenth switches SW12-SW14 are connected between output terminals of the first to third amplifiers 302, 304, and 306 and an input terminal of the A/D converter 308. The A/D converter 308 converts the output of the first to third amplifiers 302, 304, and 306 to a digital signal to output the digital signal. The current reading unit 310 reads the output of the A/D converter 308.

The switching controller 312 generates the switching control signal SC that controls on/off of the first to fourteenth switches SW1-SW14 according to the read output read by the current reading unit 310. As shown, the switching control signal SC includes a plurality of signals corresponding to the quantity of the switches. When it is detected that an off-current of the first to ninth panels 110_1-110_9 is a predetermined reference value or more, the switching controller 312 prevents a current from flowing in the corresponding panel by selectively controlling the switches using the switching control signal SC.

For example, when a failure panel is the first panel 110_1 and is detected since the detected current is greater than the predetermined value, the switching controller 312 applies a switching control signal SC corresponding to the second switch SW2 and the eighth switch SW8 thereto, or applies a switching control signal SC corresponding to the first switch SW1 and the seventh switch SW7 thereto. Accordingly, an identical potential is formed in both directions of the first panel 110_1 and thus a current does not flow to the first panel 110_1. Therefore, the on-current of adjacent panels is not affected and thus adjacent panels can be normally tested. In the present exemplary embodiment, the test unit 300 is connected to the fourth to sixth wires 120_4-120_6, however the present invention is not limited thereto and the test unit 300 may be connected to the first to third wires 120_1-120_3. While not required in all aspects, the switching controller 312 can be implemented using software and/or firmware encoded in a computer readable medium and executed using one or more processors and/or computers.

Figure 3:
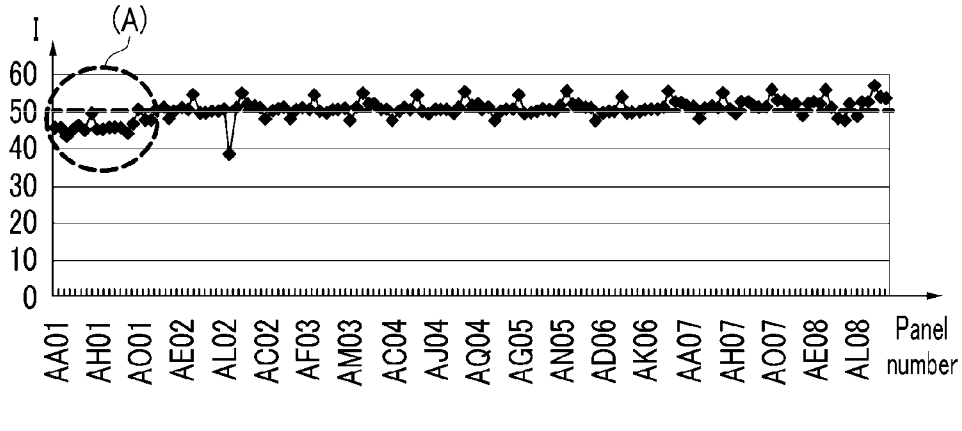
FIG. 3 is a graph illustrating current characteristics of a plurality of panels that are obtained by testing one sheet using the one sheet test device according to an exemplary embodiment of the present invention.

FIG. 3 is a graph illustrating current characteristics of a plurality of panels that are obtained by testing one sheet using the one sheet test device according to an exemplary embodiment of the present invention. In FIG. 3, a horizontal axis represents the number of a plurality of panels, and a vertical axis represents a current value in which an off-current of each panel is extracted from an on-current thereof. As shown in FIG. 3, when using the one sheet test device of the present exemplary embodiment, a panel A has a failure. However, a change of current characteristics of the remaining panels except for a panel A scarcely occurs despite the failure. That is, in a state where a panel in which a failure occurs is previously detected and a current does not flow to the detected panel, by measuring an on-current of the remaining panels, it can be prevented that current characteristics of the remaining adjacent panels are affected by the panel in which a failure occurs. Therefore, in a one sheet substrate state, current characteristics of each of a plurality of panels can be accurately tested. However, the selective supplying of current to individual panels can have other uses beyond isolating defective panels, such as where individual panel testing is performed on only selected ones of the panels on a single substrate.

As described above, according to aspects of the invention, when testing a one sheet, after detecting a failure panel, by measuring a current of normal panels except for the failure panel, a change of current characteristics due to the failure panel can be prevented.

Further, according to aspects of the invention, when testing the one sheet, by using a current stabilization time period, a current can be accurately measured.

Also, according to aspects of the invention, in a one sheet state, each panel can be independently tested.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A one sheet test device for use in testing a sheet substrate comprising a plurality of panels, a plurality of first wires that are arranged in a first direction between the plurality of panels to be connected to corresponding ones of the panels, and a plurality of second wires that are arranged in a second direction other than the first direction between the plurality of panels and connected to corresponding ones of the panels, the test device comprising:

a plurality of voltage application units that are selectively connected to the plurality of first and second wires, respectively, to apply a selected one of the first voltage and the second voltage to the panels through the corresponding first and second wires;

a test unit that controls the plurality of voltage application units to selectively measure an on-current and off-current of each of the plurality of panels; and a plurality of resistors that are connected between the plurality of second wires and the plurality of voltage application units, respectively.

2. The one sheet test device of claim 1, wherein the first voltage is a power source voltage, and the second voltage is a ground voltage.

3. The one sheet test device of claim 1, wherein each of the plurality of voltage application units comprises a power source that generates the first voltage;

a first switch selectively connected between a corresponding wire of the plurality of first and second wires and the power source; and a second switch selectively connected between the corresponding wire and an application terminal of the second voltage.

4. The one sheet test device of claim 1, wherein the test unit measures the off-current of each of the plurality of panels in a state where an inverse bias voltage is applied to the plurality of panels.

5. The one sheet test device of claim 1, wherein the test unit measures the on-current of each of the plurality of panels in a state where a bias voltage is applied to the plurality of panels.

6. The one sheet test device of claim 5, wherein the test unit detects a panel in which the off-current is a reference value or more among the plurality of panels and applies, when measuring the on-current, one of the first and second voltages to the first and second wires corresponding to the detected panel in order to prevent current from flowing to the detected panel.

7. The one sheet test device of claim 1, wherein the test unit measures the on-current after a predetermined stabilization time period has elapsed from a time point at which the on-current starts to flow.

8. The one sheet test device of claim 1, wherein the test unit comprises a plurality of amplifiers that amplify and output corresponding currents applied to the plurality of resistors;

a plurality of switches that are connected to corresponding output terminals of each of the plurality of amplifiers;

an analog to digital (A/D) converter that is connected to the plurality of switches to convert the output of the plurality of amplifiers to a digital signal;

a current reading unit that reads the output of the A/D converter; and a switching controller that generates a switching controlling signal that controls the plurality of switches and the plurality of voltage application units according to the read output.

9. A method of testing a one sheet test device comprising a sheet substrate having a plurality of panels; a plurality of first wires that are arranged on the sheet substrate in a first direction between the plurality of panels and connected to corresponding ones of the plurality of panels; a plurality of second wires that are arranged on the sheet substrate in a second direction different from the first direction between the plurality of panels and connected to corresponding ones of the plurality of panels; and a plurality of resistors that are connected between the plurality of second wires and a plurality of voltage application units, respectively, the method comprising:

measuring an off-current of each of the plurality of panels in a state where an inverse bias voltage is applied to the plurality of panels via the first and second wires; and measuring an on-current of selected ones of the plurality of panels in a state where a bias voltage is applied to the plurality of panels via the first and second wires, the selected ones of the plurality of panels being selected to exclude defective panels according to the measurement of the off-current of each of the plurality of panels.

10. The method of claim 9, wherein the measuring of an on-current comprises detecting a panel in which the off-current is a predetermined reference value or more among the plurality of panels and applying one of the first and second voltages to the first and second wires corresponding to the detected panel in order to prevent current from flowing to the detected panel.

11. The method of claim 9, wherein the measuring of an on-current is performed after a predetermined stabilization time period has elapsed from a time point at which the on-current starts to flow.

12. A one sheet test device for use in testing a sheet substrate comprising first and second panels, and wires connected to the first and second panels, the test device comprising:

a first voltage source which supplies a first voltage;

a second voltage source which supplies a second voltage;

switches which selectively connect the wires to the first and second voltage sources; and a controller which controls the switches to apply the first voltage to the first panel to prevent a current from forming in the first panel while applying the first and second voltages to the second panel to create an on-current in the second panel, and to measure the current in the second panel.

13. The one sheet test device of claim 12, wherein one of the first voltage and second voltages is a ground voltage.

14. The one sheet test device of claim 12, wherein the controller further determines that the first panel is defective by controlling the switches to apply the first voltage and second voltages to the first panel to create an off-current from in the first panel, measuring the off-current, and determining that the off-current exceeds a predetermined level.

15. The one sheet test device of claim 12, wherein the off-current is opposite in direction to the on-current.

16. A method of testing a sheet substrate comprising panels, and wires connected to the panels, the method comprising:

after applying first and second voltages to the panels via the wires to create first currents in the panels, detecting from the first currents that one of the panels is defective and another ones of the panels is not defective;

again applying the first and second voltages to the non-defective one of the panels to obtain a second current other than the first current while applying only the first voltage to the defective panel to prevent a current from flowing through the defective panel; and obtaining a test result for the non-defective panel from the second current.

17. The method of claim 16, wherein the first voltage is one of a power source voltage and a ground voltage, and the second voltage is the other one of the power source voltage and the ground voltage.

18. The method of claim 16, wherein:

a common one of the wires is connected to the defective and non-defective panels, a first one of the wires is connected to the defective panel but not the non-defective panel; and a second one of the wires is connected to the non-defective panel but not the defective panel, and the again applying the second voltage comprises applying the first voltage to the common wire while applying the first voltage to the first wire so as to prevent the current from flowing in the defective panel while applying the second voltage to the second wire to obtain the second current in the non-defective panel.

19. The method of claim 18, wherein the again applying the first and second voltages comprises:

controlling a common switch to connect a first voltage source to supply the first voltage to the common wire, controlling a first switch to connect another first voltage source to the first wire to supply the first voltage to the first wire so as to prevent the current from flowing in the defective panel while the first voltage is supplied to the common wire, and controlling a second switch to connect a second voltage source to the second wire to apply the second voltage to the second wire to obtain a current flow in the non-defective panel while the first voltage is supplied to the common wire.

* * * * *